US012141655B2

(12) United States Patent
Noel et al.

(10) Patent No.: US 12,141,655 B2
(45) Date of Patent: Nov. 12, 2024

(54) QUANTUM SYSTEM WITH MULTIPLE-WAVELENGTH ARRAY TRAP

(71) Applicant: ColdQuanta, Inc., Boulder, CO (US)

(72) Inventors: Thomas William Noel, Lafayette, CO (US); Mark Saffman, Madison, WI (US)

(73) Assignee: ColdQuanta, Inc., Boulder, CO (US)

( * ) Notice: Subject to any disclaimer, the term of this patent is extended or adjusted under 35 U.S.C. 154(b) by 727 days.

(21) Appl. No.: 17/353,306

(22) Filed: Jun. 21, 2021

(65) Prior Publication Data

US 2022/0261675 A1     Aug. 18, 2022

Related U.S. Application Data

(60) Provisional application No. 63/150,947, filed on Feb. 18, 2021.

(51) Int. Cl.
*G06N 10/00* (2022.01)
*H01S 5/343* (2006.01)

(52) U.S. Cl.
CPC ......... *G06N 10/00* (2019.01); *H01S 5/34313* (2013.01)

(58) Field of Classification Search
CPC ..... G06N 10/00; G06N 10/40; H01S 5/34313
See application file for complete search history.

(56) References Cited

U.S. PATENT DOCUMENTS

| | | |
|---|---|---|
| 5,793,091 A | 8/1998 | Devoe |
| 9,858,531 B1 | 1/2018 | Monroe |
| 11,710,061 B2 | 7/2023 | Monroe |
| 2016/0064108 A1* | 3/2016 | Saffman ............... G21K 1/006 250/251 |
| 2020/0116623 A1* | 4/2020 | Cooper-Roy .......... G02B 21/32 |
| 2020/0185120 A1 | 6/2020 | Keesling Contreras |

(Continued)

FOREIGN PATENT DOCUMENTS

| | | | | |
|---|---|---|---|---|
| WO | WO 2019014589 A1 * | 1/2019 | .............. | G06F 3/00 |
| WO | 2020142718 | 7/2020 | | |
| WO | WO 2020236574 A1 * | 11/2020 | ............. | G06N 10/40 |

OTHER PUBLICATIONS

Craig Savage, "Introduction to Light Forces, Atom Cooling, and Atom Trapping", Aust. J. Phys., 1996.*

(Continued)

*Primary Examiner* — Kandasamy Thangavelu
(74) *Attorney, Agent, or Firm* — Greenberg Traurig, LLP

(57) ABSTRACT

A trap for quantum particles, e.g., cesium atoms, is formed using electromagnetic radiation (EMR) of different wavelengths (concurrently and/or at different times). "Red-detuned" EMR, having a trap wavelength longer than a resonant wavelength for a quantum particle is "attracting" and, so, can be used to form the array trap while loading atoms into the array trap. "Blue-detuned" EMR, having a trap wavelength shorter than the resonant wavelength can repel atoms into dark areas away from the EMR peaks so that the atoms are not disturbed by interference carried by the EMR; accordingly, the blue-detuned EMR is used to form the array trap during quantum-circuit execution. Red and blue detuned EMR are used together to form deeper traps that can be used to detect vacant atom sites. Other combinations of trap wavelengths can also be used.

15 Claims, 5 Drawing Sheets

(56) References Cited

U.S. PATENT DOCUMENTS

2021/0337171 A1* 10/2021 Saffman ................. G06N 10/00
2022/0262535 A1*  8/2022 Noel ...................... G06N 10/40

OTHER PUBLICATIONS

Kleppner et al., "Highly excited atom", SAcientific American, 1981.*
Haroche et al., "Cavity quantum electrodynamics", Oct. 2012.*
Crepaz, H., Trapping and cooling rubidium atoms for quantum information, Dec. 2006.*
He et al., Combining Red and Blue-Detuned Optical Potentials to Form a Lamb-Dicke Trap for a Single Neutral Atom, Published Jan. 31, 2012, vol. 20, No. 4, Optics Express, pp. 3711-3724.
Henriet et al., Quantum Computing with Neutral Atoms, Sep. 17, 2020.

* cited by examiner

QUANTUM SYSTEM WITH MULTIPLE-WAVELENGTH ARRAY TRAP

BACKGROUND

Whereas classical digital computers manipulate bits of information, quantum computers manipulate qubits. Both classical bits and quantum qubits can be represented physically using two-state carriers. Examples of two-state quantum carriers include an electron that can assume a spin up and a spin down state, and an electron in an atom that can assume either of a ground state or an excited state. A classical two-state carrier assumes one of the two states at any given time; a quantum two-state carrier can be in a coherent superposition of both states simultaneously.

Quantum computers vary in the underlying technology used to physically represent the qubits; thus, depending on the underlying technology, the quantum state carriers can be superconducting circuits, ions, cold-neutral atoms, or other entities. One of the advantages of using cold neutral atoms or ions is that atoms of the same element and atomic weight are naturally identical so that manufacturing tolerances are not an issue (as they may be when the qubits are defined in states of superconducting circuits). Another advantage of cold neutral atoms is that they can be packed closely together without interacting, in contrast to, for example, ions. On the other hand, neighboring cold atoms can be made to interact by causing them to enter Rydberg (very high excitation) states. Thus, cold atoms readily provide for relatively large qubit-count quantum registers.

In a cold neutral atom register, atoms are held in a one-, two-, or three-dimensional array trap, e.g., formed as a grid of crisscrossing laser beams. The laser beams can be "red detuned", i.e., have a longer wavelength than the resonance wavelength associated with a given quantum-state transition. In this red-detuned case, the atoms are attracted to and held in place by the light intensity peaks.

Alternatively, the laser beams can be "blue-detuned" so that they have a wavelength somewhat shorter than the wavelength associated with the given quantum state transition. In this blue-detuned case, atoms are repelled by the intensity maxima and thus confined to dark areas bounded by laser light.

DETAILED DESCRIPTION

The present invention provides for an array trap that is formed using light of different wavelengths. In synchronic embodiments, both two or more different wavelengths can be used concurrently; in diachronic embodiments, two or more different wavelengths can be used at different times. Some embodiments use different wavelengths both at different times and concurrently.

Any added complexity associated with switching and/or combining wavelengths used for an array trap can be more than offset by leveraging advantages specific to each of the different wavelengths. For example, it can be relatively difficult to load atoms into a blue-detuned array trap that is trying to repel atoms as they are being loaded; accordingly, a red-detuned wavelength can be used for populating an array with atoms. On the other hand, since atoms are located at light-intensity minima in a blue-detuned array trap, they can be insulated from issues caused by the presence of trapping light (e.g., scattering, heating, light shifts, and decoherence); thus, a blue-detuned array trap can be appropriate for a quantum-circuit execution phase of an operational cycle. Finally, atoms can be confined more securely in a trap using both red-detuned and blue-detuned light, which can be beneficial when probing an array trap for vacant sites.

Figure 1:
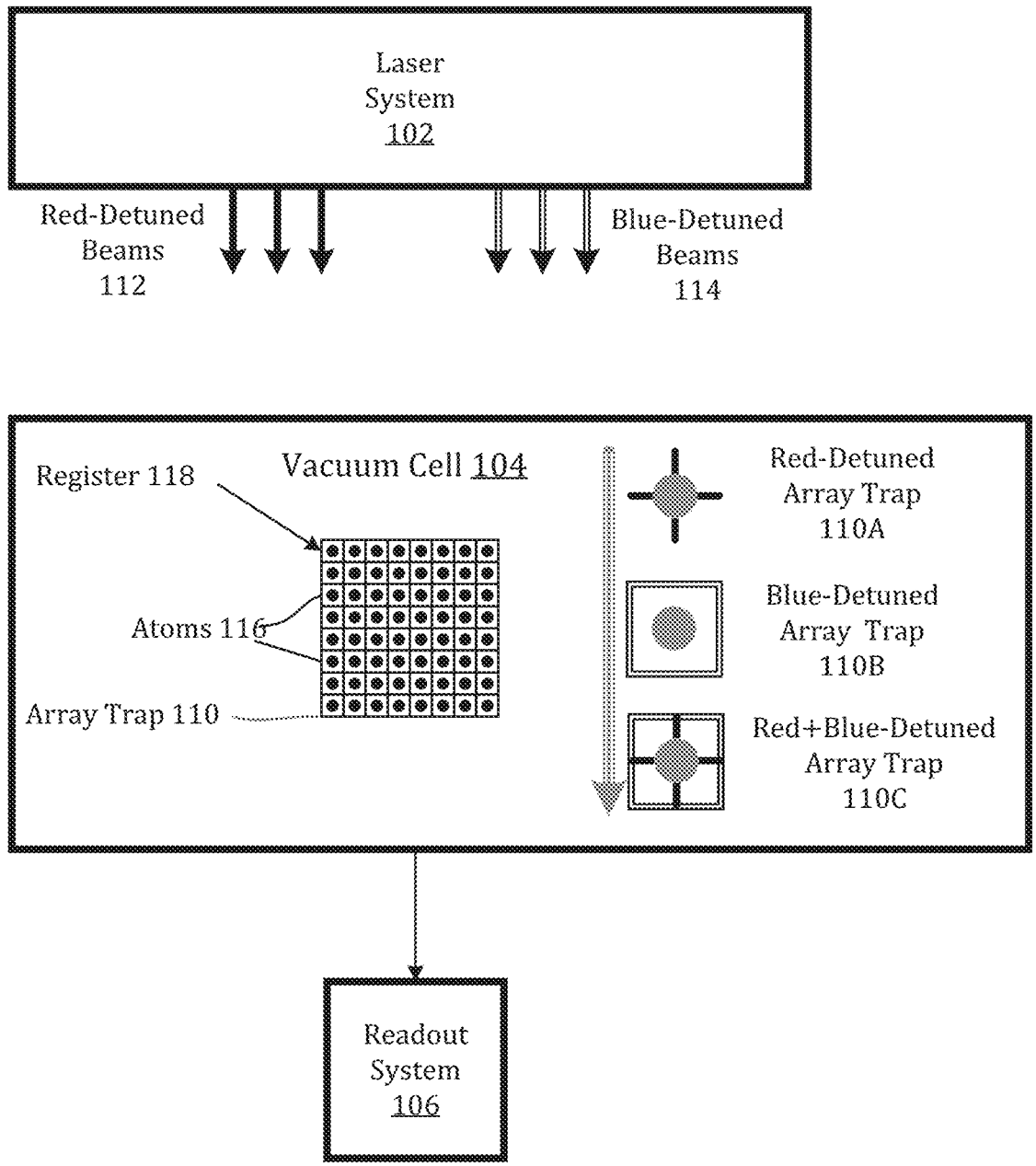
FIG. 1 is a schematic diagram of a quantum computer system that uses both red and blue detuned light to form a quantum register.
Figure 2:
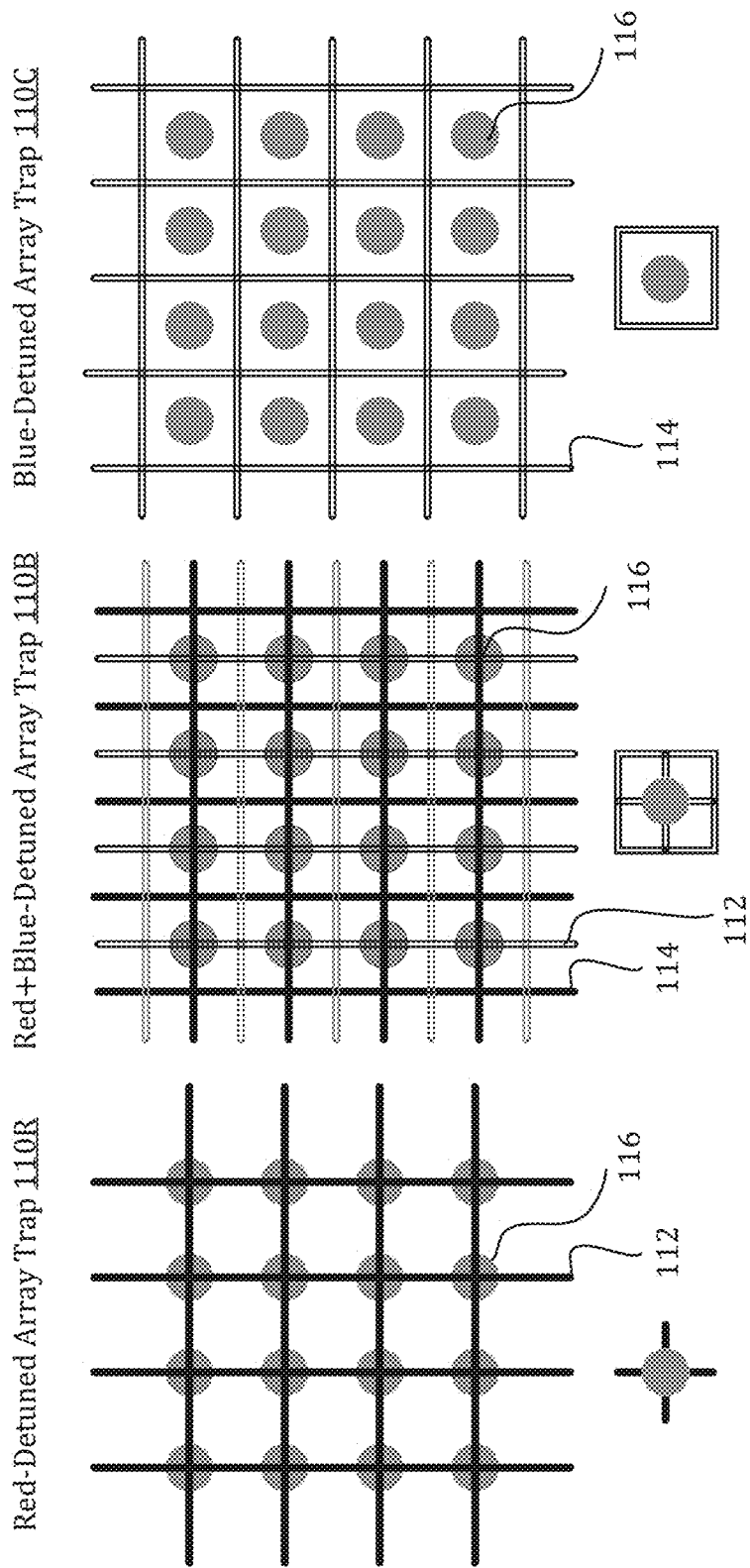
FIG. 2 is a conceptual diagram representing array traps of red-detuned light, blue-detuned light, and red and blue detuned light.

As shown in FIG. 1, a quantum computer system 100 includes a laser system 102, a vacuum cell 104, and a readout system 106. Laser system 102 can output sets of plural beams with the same wavelengths and plural sets of different wavelengths concurrently as needed to establish an array trap 110. For example, laser system 102 can output a set of red-detuned beams 112 and a set of blue detuned beams 114 concurrently or in sequence. Depending on the wavelengths being used, array trap can be an attracting, red-detuned array trap 110R, a repelling, blue-detuned array trap 110B, or a combined red and blue detuned array trap 110C (see FIG. 2). Array trap 110 (FIG. 1) can be populated with atoms, e.g., cesium 133 ($^{133}$Cs) atoms 116 to complete a quantum register 118. Readout system 106 is used to characterize quantum states of atoms 116 and to detect any vacant (e.g., due to loss of an atom) sites of register 118.

Figure 3:
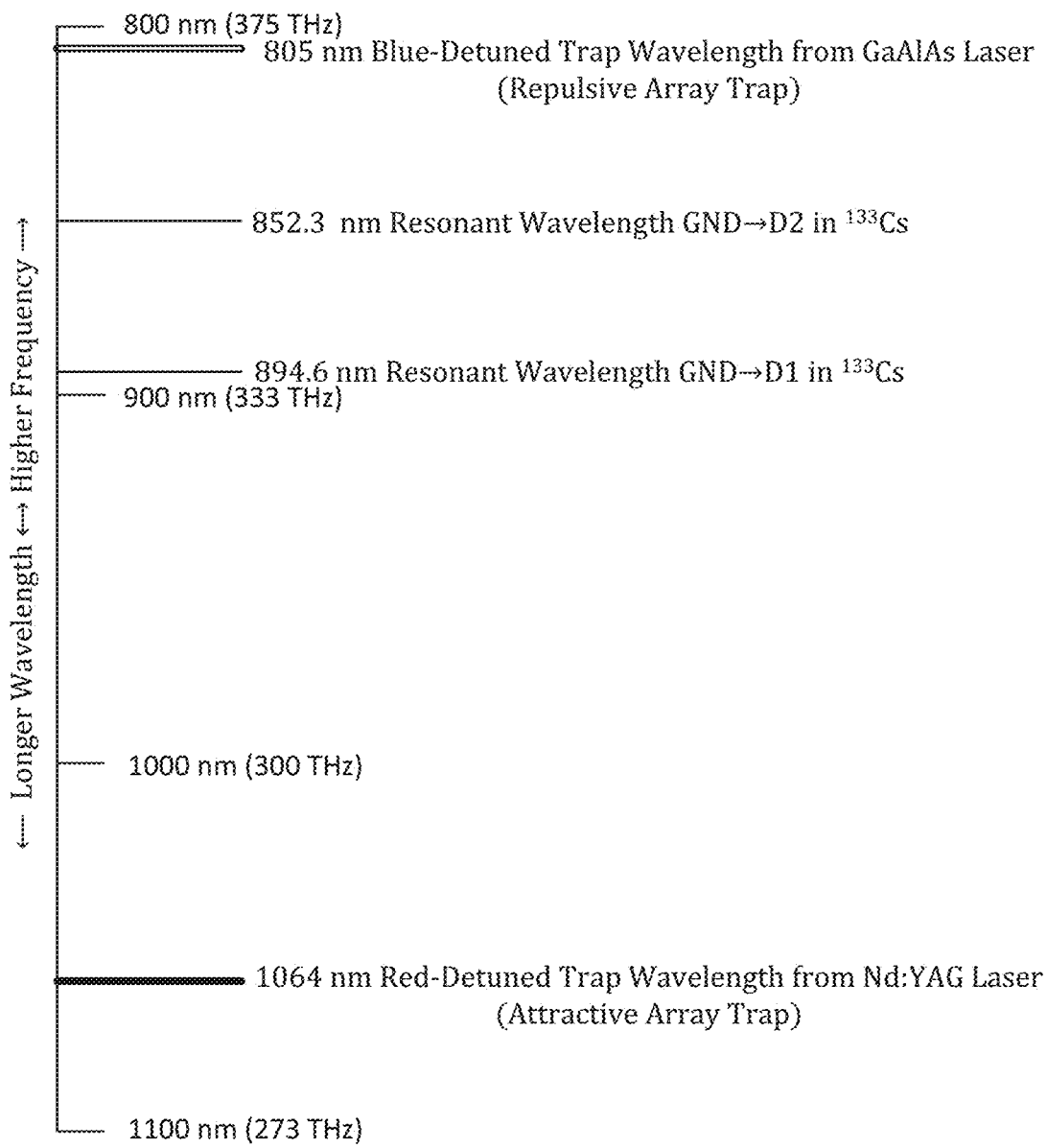
FIG. 3 is a chart of the resonant wavelengths and array trap wavelengths that are blue or red detuned relative to the resonant wavelengths used in the quantum computer system of FIG. 1.

Wavelengths used in quantum computer system 100 are indicated in FIG. 3. In cesium, the lowest frequency optical transition from the ground state is the D1 line at 894.6 nm. Thus, light with wavelength greater than 894.6 nm qualifies in this context as "red-detuned" and will result in attractive trapping potentials. System 100 uses light at 1064 nm, which is readily available from a ytterbium fiber laser.

In principle, light with wavelength below 894.6 can be considered "blue-detuned" with respect to the D1 resonance. However, light with wavelengths between 852.3 nm and 894.6 nm is "red-detuned" with respect to a D2 resonance of cesium at 852.3 nm; determining whether the result would be attractive or repulsive is complicated as it is determined by the interplay between the effects of the two resonances with the nearer resonance exerting a generally larger influence. In practice, these intermediate wavelengths are typically not used for technical reasons (light scattering, relatively large tensor polarizabilities, etc.). Instead, when "blue-detuned" repulsive potentials are desired for $^{133}$Cs atoms, light at wavelengths blue-detuned with respect to the D2 line (i.e., light at wavelengths lower than 852.3 nm) can be used. Any near infrared wavelength below 852.3 nm can in principle be used. In system 100, 805 nm light which is readily available from a gallium-aluminum-arsenide (GaAlAs) diode laser, is used to form a repulsive array trap. If other quantum transitions for cesium are used or if rubidium 87 or other atomic or molecular moiety is used, then other resonant wavelengths and trap wavelengths may be used.

Figure 4:
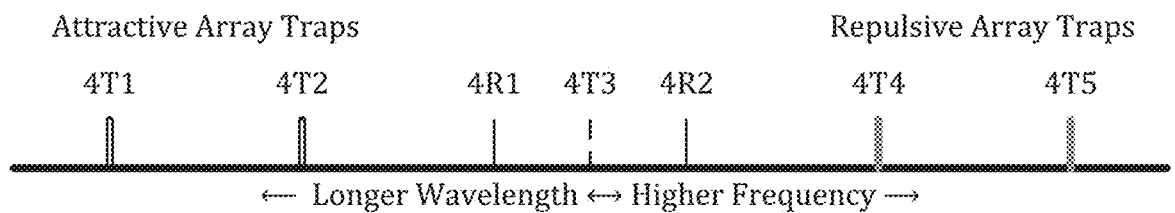
FIG. 4 is a chart showing different arrangements of trap wavelengths and resonant wavelengths.

As shown in FIG. 3, the red-detuned and the blue-detained trap wavelengths straddle the resonant wavelengths. However, many other arrangements are possible as indicated in FIG. 4. For example, trap wavelengths 4T1 and 4T2, which are both longer than resonant wavelength 4R1, can be used as the different wavelengths. Likewise, trap wavelengths 4T4 and 4T5, which are both shorter than resonant wavelength 4R2, can be used as the different trap wavelengths. Trap wavelength 4T3, which is between resonant wavelengths 4R1 and 4R2, can be combined with any of 4T1, 4T2, 4T4, and 4T5, or other wavelengths between resonant wavelengths 4R1 and 4R2. The present invention provides use cases for all of these arrangements.

Figure 5:
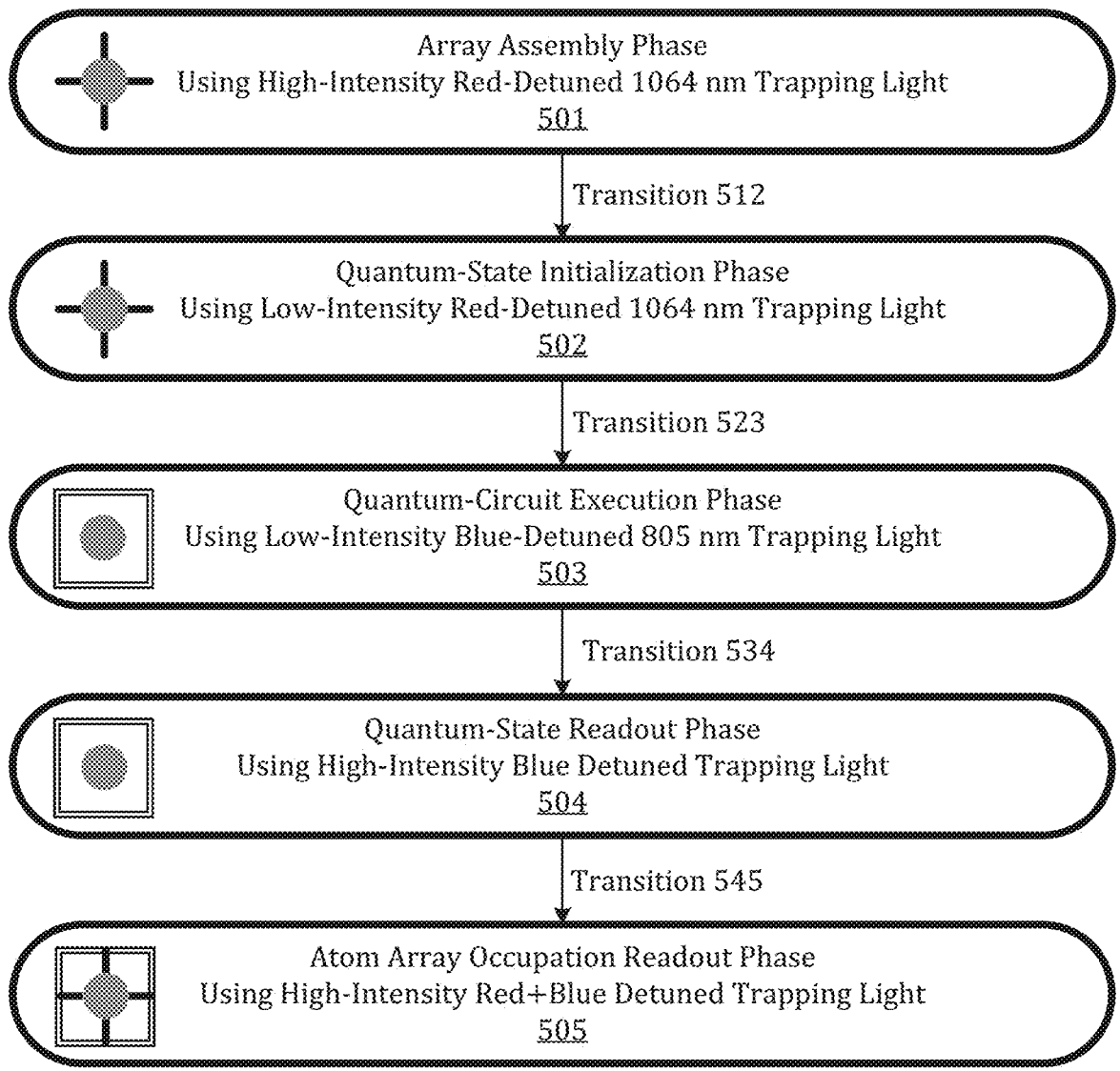
FIG. 5 is a flow chart of a quantum computing process used in the quantum computer system of FIG. 1 and employing grids of both blue detuned light and red-detuned light.

A multi-wavelength quantum computing process 500 using cold neutral atoms is flow charted in FIG. 5. An array assembly phase 501 uses a high-intensity red-detuned 1064 nm trapping light to populate an array trap. Array assembly phase 501 can include several subphases including an atom cloud generation subphase, an atom cloud compression subphase, an atom array loading subphase, a post-loading atom array cooling subphase, an atom array consolidation subphase, and an array initialization phase. The atom array consolidation subphase can consist of an atom array occupation readout subphase and an atom rearrangement subphase, which can incur some atom heating. Accordingly, the array initialization subphase cools the atoms using high-intensity red-detuned 1064 nm trapping light. A quantum state initialization phase 502 uses low-intensity red-detuned 1064 nm trapping light as atoms are set to initial values. This can involve, for example, setting all atoms to an initial ground quantum state.

A quantum circuit execution phase 503 uses low, tailored intensity blue-detuned 805 nm trapping light during quantum circuit execution. During quantum circuit execution, atoms can be transitioned to Rydberg states to allow atoms to interact. High dipole moments associated with the Rydberg states make the atoms sensitive to electro-magnetic artifacts associated with the light used to form the array trap. Furthermore, red-detuned trapping potentials are anti-trapping for Rydberg states, while Rydberg states remain trapped in blue-detuned configurations. Using a repelling, blue-detuned array trap urges atoms away from the bright grid lines and into dark regions of the trap; this helps reduce the influence of the trapping light on the Rydberg atoms. Potential perturbations due to the blue-detuned trapping light are further reduced by keeping its intensity low. The intensity of the blue-detuned trap may be tailored to match the trapping influence on Rydberg and ground state atoms to qubit maximize coherence through quantum circuit execution.

A quantum-state readout phase 504 uses high intensity blue detuned trapping light to secure the positions of atoms as they are probed to determine the results of circuit-execution. In an alternative embodiment, red-detuned trapping light is used in addition to the blue-detuned light to provide deeper traps and reduce loss (at the expense of additional off-resonant scattering from the red-detuned light.) An atom array occupation readout phase 505 uses high intensity red and blue detuned trapping light to secure the positions of atoms as a probe beam is used to detect vacated trap sites, e.g., from which atoms have been lost. The vacated sites can then be reloaded for a new quantum computing cycle.

In the example of FIG. 5, there are four transitions: transition 512 involves a decrease in intensity of the red-detuned trapping light; transition 523 involves a "color" switch (e.g., cross-fade) from low-intensity red-detuned trapping light to low-intensity blue-detuned trapping light transition 534 involves an intensity increase in the blue-detuned trapping light and transition 545 involves adding high-intensity red-detuned trapping light to the high-intensity blue-detuned trapping light. In other scenarios, there can be transitions: from blue-detuned trapping light to red detuned trapping light, from red-detuned directly to red and blue detuned trapping light, between different red-detuned wavelengths; and between different blue-detuned wavelengths.

Figure 6:
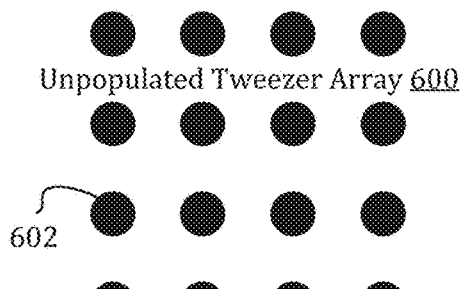
FIG. 6 is a representation of an unpopulated (red-detuned) optical-tweezer array trap.
Figure 7:
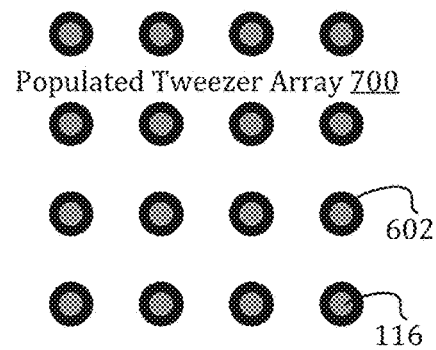
FIG. 7 represents the optical tweezer array trap of FIG. 6 populated with atoms.
Figure 8:
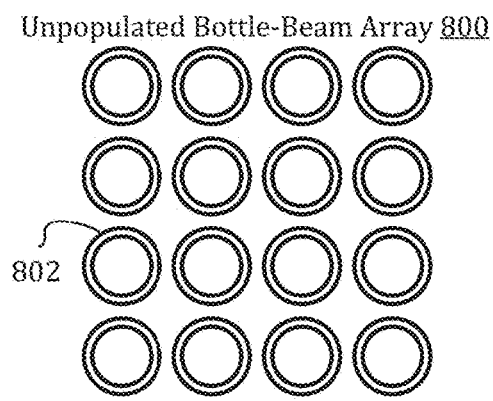
FIG. 8 represents an unpopulated (blue-detuned) bottle-beam array trap.
Figure 9:
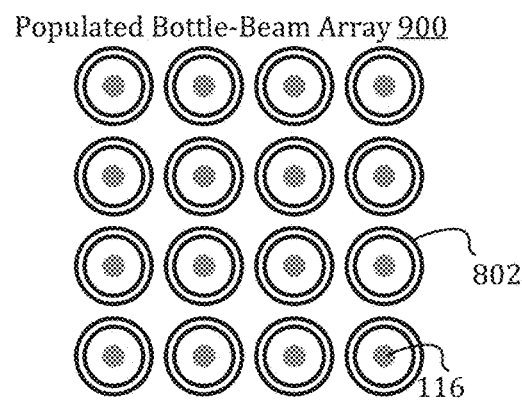
FIG. 9 represents the bottle-beam array trap of FIG. 8 populated with atoms.

As shown in FIG. 3, array traps can be formed using orthogonal sets of plural parallel laser beams, which may be red detuned or blue detuned. However, the invention provides for alternative approaches to forming array traps. For example, FIG. 6 shows an unpopulated array trap formed of a two-dimensional array 600 of optical tweezers 602. As shown in FIG. 7, a populated tweezer array can include atoms 116 held by respective tweezers 602. The tweezers are necessarily red detuned, while FIG. 8 shows an unpopulated bottle-beam array 800 of bottle beams 802 formed using blue-detuned light. A populated bottle-beam array 900 shows bottle beams 802 along with respective trapped atoms 116.

Figure 10:
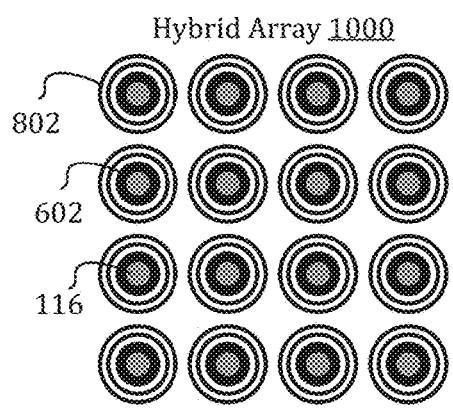
FIG. 10 represents a populated hybrid array trap including bottle-beams and optical tweezers.
Figure 11:
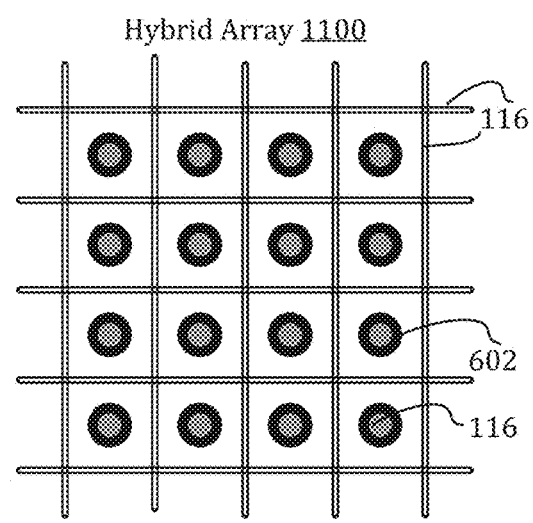
FIG. 11 represents a populated hybrid array trap including optical tweezers and orthogonal sets of parallel blue-detuned beams.

FIG. 10 shows a populated hybrid array 1000 with atoms 116 trapped in both (blue-detuned) bottle beams 802 and (red-detuned) optical tweezers 602. FIG. 11 shows another hybrid array 1100 combining red-detuned optical tweezers 602 with orthogonal sets of blue-detuned laser beams 116 populated with atoms 116. Other array traps can also be used, e.g., a bottle beam array with a red-detuned array formed of orthogonal sets of parallel red-detuned beams.

There are two main types of optical traps: red detuned and blue detuned. In red detuned traps, light provides an attractive potential and atoms are localized at regions of high intensity. In a blue detuned trap, the light is repulsive, and atoms are localized at a local minimum of the intensity. The trapping light contributes to decoherence of atomic qubits due to energy shifts that are proportional to the light intensity as well as to light scattering. The light scattering is proportional to the intensity provided the atoms are not so cold that quantization of the trap energy levels has to be considered. For these reasons, blue detuned traps result in less decoherence than red detuned traps. This advantage has to be weighed against the increased complexity of creating local minima of the intensity, compared to the relative simplicity of creating local maxima.

The simplest red detuned trap is a TEM$_{00}$ Gaussian beam focused to a small waist $w_0$. Let the beam propagate along z so the intensity distribution is $$I(\rho, z) = I_0 \frac{e^{-2\rho^2/w^2(z)}}{1 + z^2/L_R^2}$$

where $I_0$ is the peak intensity, $w(z) = w_0\sqrt{1+z^2/L_R^2}$, $L_R = \pi w_0^2/\lambda$ is the Rayleigh length, and $\rho = \sqrt{x^2+y^2}$. An array of red traps can be readily prepared using a diffractive beam splitter to create multiple copies of an input Gaussian beam, a spatial light modulator, or an acousto-optic deflector, or by other means.

As taught in M. Saffman and T. G. Walker, "Analysis of a quantum logic device based on dipole-dipole interactions of optically trapped Rydberg atoms", Phys. Rev. A 72, 022347 (2005), incorporated by reference herein, the spring constants are $$\kappa_x = \kappa_y = 4\frac{|U|}{w_0^2}, \kappa_z = 2\frac{|U|}{L_R^2}$$

where U is the trap depth. In the simplest case of a scalar atomic polarizability the trap depth is $$U = -\frac{I_0}{2\epsilon_0 c}\alpha$$

where $\alpha$ is the polarizability at the trap wavelength, $\epsilon_0$ is the permittivity of vacuum, and c is the speed of light.

The corresponding oscillation frequencies $\omega=\sqrt{(\kappa/m)}$ are $$\omega_x = \omega_y = \frac{2}{w_0}\left(\frac{|U|}{m}\right)^{1/2}, \kappa_z = \frac{\sqrt{2}}{L_R}\left(\frac{|U|}{m}\right)^{1/2}$$

In the thermal limit of many occupied vibrational modes the variance of the atom position is $$\sigma_x^2 = \sigma_y^2 = \frac{\kappa_B T}{\kappa_x} = \frac{w_0^2}{4}\frac{\kappa_B T}{|U|}, \sigma_z^2 = \frac{\kappa_B T}{\kappa_z} = \frac{L^R}{2}\frac{\kappa_B T}{|U|}$$

In practice a direct measurement of u is difficult but w can be measured by parametric heating. The atom localizationis then given by $$\sigma_j^2 = \frac{\kappa_B T}{m\omega_j^2}$$

Preparing an array of local minima of the optical intensity, as is required for blue detuned trapping, is generally more complicated than preparing many local maxima of the intensity. One approach is to create a so-called optical bottle beam which is a dark spot surrounded by light in all directions, as taught in G. Li, S. Zhang, L. Isenhower, K. Mailer, and M. Saffman "A crossed vortex bottle beam trap for single-atom qubits", Opt. Lett. 37, 851 (2012), incorporated by reference herein. The bottle beam can then be copied using a diffractive beam splitter in the same way as can be done for red detuned traps.

Another generic approach is to create a pattern of light that provides a two-dimensional array of local minima on a regularly spaced grid. Examples of this approach are as described in patents U.S. Pat. Nos. 9,355,750 B2 and 10,559392 B1. While there are many possible methods of preparing arrays of blue traps, they generally require more optical power for a given trapping potential. This is because the light distribution in a blue detuned trap must be delocalized and must surround the trapped particle from all sides.

In a red detuned, attractive potential it is sufficient to focus the light to a single point. Thus, in a red detuned trap, a high intensity and a deep trap potential can be achieved with a smaller optical power.

Off-resonant light-atom interactions are dominated by the effects of atom scalar polarizability. The sign of the polarizability, which determines whether the light-atom interaction is attractive or repulsive, is determined by the detuning of the light with respect to the nearest atomic resonance, with more distant atomic resonances and playing a subordinate role. Light detuned to the red (lower frequency, longer wavelength) of an atomic resonance results in a positive polarizability can be positive and, thus, an attractive interaction. Light detuned to the blue (higher frequency, shorter wavelength) of a nearby atomic resonance results in a negative polarizability and, thus, a repulsive interaction.

In the case of a red-detuned (attractive) potential, the atom is attracted toward increasing light intensity. Thus, if a three-dimensional spatial maximum of light intensity is generated, then sufficiently cold atoms will be trapped in the resulting trapping potential. In the case of blue-detuned (repulsive) potentials, the atom is repelled by regions of high light intensity. Thus, if a three-dimensional spatial minimum of light intensity is generated, then a sufficiently cold atom residing inside this region is trapped by the resulting trapping potential.

Because atoms in blue-detuned optical traps are located at minima of optical intensity, they can be insulated from issues caused by the presence of trapping light (scattering, heating, light shifts, decoherence) which may make them more appropriate for some portions of the operational cycle, e.g., the quantum operations portion of quantum circuit execution. However, generating intensity maxima using red-detuned light is more straightforward than generation of three-dimensional spatial optical intensity minima and therefore less prone to defects (aberration, non-uniformity, etc.) than generating intensity minima using blue-detuned light. Also, the spatial distribution of vector light shifts in red-detuned traps can be simpler to manage.

Generating higher trap frequencies may be practically easier in red-detuned attractive tweezers. In practice, it may be easier to generate deeper traps using red-detuned light than using blue-detuned light. Having access to both red and blue traps in one system can relax different requirements on both optimizing the red-detuned traps for one part of the cycle and optimizing the blue-detuned traps for another part of the cycle. For instance, if the blue-detuned traps are used for all quantum operations, but not for cooling, and only near-motional-ground-state atoms ever reside in the blue-detuned traps, then the blue-detuned traps need not be very deep; this can allow more favorable laser technology and/or more distant detunings which further improve the coherence performance of the system. If the red traps are not used during quantum operations, but only during loading, cooling, and readout, then the impact of using smaller detunings can be easier to manage, allowing for deeper, tighter traps, resulting in better qubit array preparation (loading, rearrangement, occupation measurement, motional state preparation, and, in some cases, quantum state preparation) and better quantum state readout retention performance.

While most of the foregoing wavelength transitions have been between one red-detuned wavelength and one blue-detuned wavelength, the invention' also provides for transitions between two different red detuned wavelengths 4T1 and 4T2 in FIG. 4 and between two different blue detuned wavelengths 4T4 and 4T5. Also provided for are transitions to and from wavelengths 4T3 that are red-detuned with respect to one resonance 4R2 wavelength and blue detuned with respect to another resonant wavelength e.g., wavelengths between the D1 and D2 resonant wavelengths for cesium. As an alternative to turning wavelengths on and off, two or more wavelengths can be left on with transitions involving changing the relative intensities of (e.g., crossfading) the concurrent wavelengths.

Herein, "quantum particle" refers to a particle capable of assuming alternative quantum states. In the present context, the quantum particles of interest include atoms and polyatomic molecules. Herein, "trapping" encompasses capturing particles in a trap and also preventing particles in a trap from escaping the trap.

The wavelengths discussed above are within the infrared range. In the context of the infrared range, the terms "red-detuned" and "blue-detuned" are commonly accepted misnomers since red-colored light and blue colored light both have wavelengths shorter than infrared wavelengths. In the context of the visible light spectrum, red has the longest wavelength and blue has the shortest wavelength. In that context, it makes sense that "red detuning" would involve a longer wavelength relative to some reference and "blue detuning" would involve a shorter' wavelength than the reference. By convention, the meanings of "red detuned" and "blue detuned" in the visible light context have been transposed to the infrared light context. Alternatively, "red-detuned" wavelengths can be referred to as "attracting" wavelengths and "blue-detuned" wavelengths can be referred to as "repelling" wavelengths. The invention provides for trap and resonant wavelengths in various electromagnetic radiation (EMR) ranges including the visible and ultra-violet ranges as well as in the infrared range.

Herein, all art labelled "prior art", if any, is admitted prior art; all art not labelled "prior art", if any, is not admitted prior' art. The disclosed embodiments, variations thereupon, and modifications thereto are provided for by the present invention, the scope of which is defined by the following claims.

What is claimed is:

1. A quantum computing process comprising:
    loading atoms into an array trap while the array trap is formed using attracting light such that the atoms are attracted to intensity maxima of the attracting light;
    executing a quantum circuit while the array trap is formed using repelling light such that the atoms are repelled from intensity maxima of the repelling light and confined to relatively dark regions of the array trap, wherein the atoms have a first resonant wavelength, wherein the attracting light has a first trap wavelength longer than the first resonant wavelength, and wherein the repelling light has a second trap wavelength shorter than the first resonant wavelength.

2. A quantum-particle trapping system comprising:
    a vacuum cell; and
    a laser system for providing electromagnetic radiation (EMR) of plural trap wavelengths to be used to form an array trap for trapping quantum particles, the plural trap wavelengths including a first trap wavelength and a second trap wavelength, the second trap wavelength being different from the first trap wavelength, the quantum particles including a first quantum particle, wherein the first quantum particle has a first resonant wavelength, and wherein the second trap wavelength is between the first trap wavelength and the first resonant wavelength.

3. The quantum-particle trapping system of claim 2 wherein the array trap is formed using EMR of the first trap wavelength and EMR of the second trap wavelength concurrently.

4. The quantum-particle trapping system of claim 2 wherein the trapping of quantum particles in an array trap while the array trap is formed using EMR of the first trap wavelength occurs while EMR of the second trap wavelength is not used to form the array trap.

5. The quantum-particle trapping system of claim 2 wherein the first quantum particle has a second resonant wavelength different from the first resonant wavelength, the first trap wavelength being between the first resonant wavelength and the second resonant wavelength.

6. The quantum-particle trapping system of claim 2 wherein the first resonant wavelength is between the first trap wavelength and the second trap wavelength.

7. The quantum-particle trapping system of claim 6 wherein:
    the laser system is configured to load quantum particles including the first quantum particle into the array trap while the array trap is formed using EMR of the first trap wavelength; and
    quantum circuits are executed while the array trap is formed using EMR of the second trap wavelength.

8. The quantum-particle trapping system of claim 7 further comprising a readout system for reading out quantum states of the quantum particles while the array trap is formed using EMR of both the first and second trap wavelengths.

9. A quantum-particle trapping process comprising:
    trapping quantum particles including a first quantum particle in an array trap while the array trap is formed using electro-magnetic radiation (EMR) of a first trap wavelength; and
    trapping the quantum particles including the first quantum particle in the array trap while the array trap is formed using EMR of a second trap wavelength different from the first trap wavelength, wherein the first quantum particle has a first resonant wavelength, and wherein the second trap wavelength is between the first trap wavelength and the first resonant wavelength.

10. The quantum-particle trapping process of claim 9 wherein the array trap is formed using EMR of the first trap wavelength and EMR of the second trap wavelength concurrently.

11. The quantum-particle trapping process of claim 9, wherein the trapping quantum particles including a first quantum particle in an array trap while the array trap is formed using electro-magnetic radiation (EMR) of the first trap wavelength occurs while EMR of the second trap wavelength is not used to form the array trap.

12. The quantum-particle trapping process of claim 9 wherein the first quantum particle has a second resonant wavelength different from the first resonant wavelength, the first trap wavelength being between the first resonant wavelength and the second resonant wavelength.

13. The quantum-particle trapping process of claim 9 wherein the first resonant wavelength is between the first trap wavelength and the second trap wavelength.

14. The quantum-particle trapping process of claim 13 wherein:
    quantum particles including the first quantum particle are loaded into the array trap while the array trap is formed using EMR of a first trap wavelength; and
    quantum circuits are executed while the array trap is formed using EMR of the second trap wavelength.

15. The quantum-particle trapping process of claim 14 further comprising reading out quantum states of the quantum particles while the array trap is formed using EMR of both the first and second trap wavelengths.

* * * * *